United States Patent [19]

Danbayashi

[11] Patent Number: 5,477,493
[45] Date of Patent: Dec. 19, 1995

[54] SEMICONDUCTOR DEVICE HAVING A BOUNDARY SCAN TEST CIRCUIT

[75] Inventor: Hirokazu Danbayashi, Tokyo, Japan

[73] Assignee: NEC Corporation, Tokyo, Japan

[21] Appl. No.: 317,606

[22] Filed: Sep. 29, 1994

[30] Foreign Application Priority Data

Oct. 4, 1993 [JP] Japan .................... 5-247829

[51] Int. Cl.$^6$ ............................ G11C 7/00; G01R 31/28
[52] U.S. Cl. ............................................ 365/201; 371/22.3
[58] Field of Search ............................ 365/201, 189.12, 365/240; 371/22.3, 22.1

[56] References Cited

U.S. PATENT DOCUMENTS

| | | | |
|---|---|---|---|
| 5,220,281 | 6/1993 | Matsuki | 371/22.3 X |
| 5,260,947 | 11/1993 | Posse | 371/22.3 |
| 5,260,948 | 11/1993 | Simpson et al. | 371/22.3 |
| 5,260,950 | 11/1993 | Simpson et al. | 371/22.3 |
| 5,341,096 | 8/1994 | Yamamura | 324/765 |

FOREIGN PATENT DOCUMENTS

| | | |
|---|---|---|
| 0487941A2 | 6/1992 | European Pat. Off. . |
| 0489511A2 | 6/1992 | European Pat. Off. . |
| 0560500A1 | 9/1993 | European Pat. Off. . |

*Primary Examiner*—David C. Nelms
*Assistant Examiner*—Son Dinh
*Attorney, Agent, or Firm*—Whitham, Curtis, Whitham & McGinn

[57] ABSTRACT

A boundary scan test circuit comprises a plurality of register cells correspondingly to external pins of a semiconductor device, the register cells being coupled together to form a shift register during a test operation mode. The register cells includes a first selector for selecting one of a parallel input data, serial input data and a code signal, a first register for latching the output of the first selector to output a serial data to be input to a succeeding register cell, a second register for latching the output of the first selector, a second selector for selecting the parallel data or the output of the second register to output parallel data. The code signal is determined based on corresponding one of bits of ID code of the semiconductor device. The ID code is output from the register cells without providing an ID code register, resulting in a simple construction of the register cells and a reduced chip area for the semiconductor device.

3 Claims, 10 Drawing Sheets

5,477,493

SEMICONDUCTOR DEVICE HAVING A BOUNDARY SCAN TEST CIRCUIT

BACKGROUND OF THE INVENTION

1. Field of the Invention

The present invention relates to a semiconductor device having a boundary scan test circuit and, more particularly, to an improvement on data registers in a boundary scan test circuit of a semiconductor integrated circuit.

2. Description of the Related Art

In a test for semiconductor devices which are fabricated by using advanced technology such as surface mounting, tape automated bonding, a multichip module and a complicated ASIC, there is a problem that all nodes of each IC tip mounted on the circuit board or molded in a package cannot be tested by a conventional test using an IC tester.

A boundary scan test is one of methods for determining whether or not a semiconductor device mounted on a circuit board is suitably fabricated. The boundary scan test is used to examine that each of designated IC chips is properly mounted on a circuit board, that all connection pins of each IC chip are properly connected to corresponding terminal of the circuit board, and that an internal logic circuit of each IC chip provides a predetermined function.

FIG. 1 is a schematic perspective view showing the structure of a semiconductor device in which a boundary scan test is carried out. As shown in this drawing, the semiconductor device is provided with connection pins composed of input pins 53 and output pins 53a. Boundary scan register cells 31 on the input side are disposed between the input pins 53 and an internal logic circuit 38, while boundary scan register cells 31a on the output side are disposed between the internal logic circuit 38 and the output pins 53a. In an ordinary (normal) operation mode, each of the register cells 31 transmits input data from associated one of the input pins to the internal logic circuit 38 as it is, while each of the register cells 31a transmits output data obtained from the internal logic circuit 38 to associated one of the output pins 53a as it is.

All of the boundary scan register cells 31 and 31a form a single shift register 60 when serially connected to each other as shown in FIG. 1. Resulting from such a construction, in a test operation mode, a set of test signals are input through a test data input terminal TDI or directly input to input pins 53 in accordance with one of the test operation modes, and then supplied to the internal logic circuit 38. Also, test data from the internal logic circuit 38 are output through a test data output terminal TDO or are directly output from output pins 53a. Other than the register cells 31 and 31a, there are provided an identification (ID) code register 32, a bypass register 33 and an instruction register 34.

In a semiconductor device having the boundary scan test circuit as described above, it is necessary to provide a large number of registers for the boundary scan test circuit, resulting in a larger chip area of the semiconductor device although it is requested to have a smaller chip area.

In view of the foregoing, an object of the present invention is to provide a boundary scan test circuit for a semiconductor device in which a reduced number of registers for the boundary scan test circuit is provided, thereby obtaining a reduced chip area for the semiconductor device.

In accordance with the present invention, there is provided a semiconductor device comprising an internal logic circuit, a plurality of external pins and a boundary scan test circuit including a plurality of boundary scan register cells each disposed correspondingly to associated one of the external pins for transmitting parallel data between the internal logic circuit and associated one of the external pins, the boundary scan register cells being electrically connected to each other responsive to an external signal to form a shift register for transmitting serial data.

In a first aspect of the present invention, each of the boundary scan register cells in the boundary scan test circuit comprises: a first selector having a first input for inputting the parallel data, a second input for inputting the serial data and a third input for inputting a code signal representing a bit of an ID code of the semiconductor device, the first selector selecting one of the parallel data, serial data and code signal in accordance with an input switching signal; a first register for latching an output signal from the first selector in response to a first latch signal; a second register for latching an output signal from the first register in response to a second latch signal; and a second selector for selecting the parallel data or an output signal from the second register in accordance with an output switching signal, an output signal from the first register of one of the boundary scan register cells constituting the serial data to be input to succeeding one of the boundary scan register cells when the boundary scan register cells are connected to form the shift register. The third input of the first selector is preferably maintained at a first potential or a second potential in accordance with the bit of the ID code.

In a second aspect of the present invention, each of the register cells in the boundary scan test circuit comprises a first selector for selecting one of the parallel data and the serial data in accordance with an input switching signal; a first register for latching an output signal from the first selector in response to a first latch signal, the first register further being set or reset in accordance with a code signal representing a bit of an ID code of the semiconductor device in response to a second external signal; a second register for latching an output signal from the first register in response to a second latch signal; and a second selecting circuit for selecting the parallel data or an output signal from the second register in accordance with an output switching signal, an output signal from the first register of one of the boundary scan register cells constituting the serial data to be input to succeeding one of the boundary scan register cells when the boundary scan register cells are connected to form the shift register.

With the semiconductor device according to the present invention, in a test operation mode, parallel data, serial data, or a code signal representing a bit of an identification code of the semiconductor device is selected by the first selector in each of boundary scan register cells constituting a shift register when coupled together, thereby making it possible to transmit a test data by the shift register in the test operation mode, while parallel data input in the normal operation mode can be supplied to the internal logic circuit or the connection pins. Further, the code signal representing a bit of an ID code of the semiconductor device is output directly from each of the boundary scan register cells, so that the ID code can be read out from the shift register. Hence, it is not necessary to include in a boundary scan register cell an identification code register for storing the code signal of the semiconductor device. Accordingly, it is possible to simplify the structure of a semiconductor device having a boundary scan test circuit, thereby reducing the chip area of the semiconductor device.

BRIEF DESCRIPTION OF THE DRAWINGS

The above and further objects as well as features and advantages of the present invention will be more apparent from the following description, taken in conjunction with accompanying drawings in which.

DESCRIPTION OF THE PREFERRED EMBODIMENTS

Before describing embodiments of the present invention, problems in a conventional boundary scan test circuit will be described for the sake of understanding of the present invention.

Figure 1:
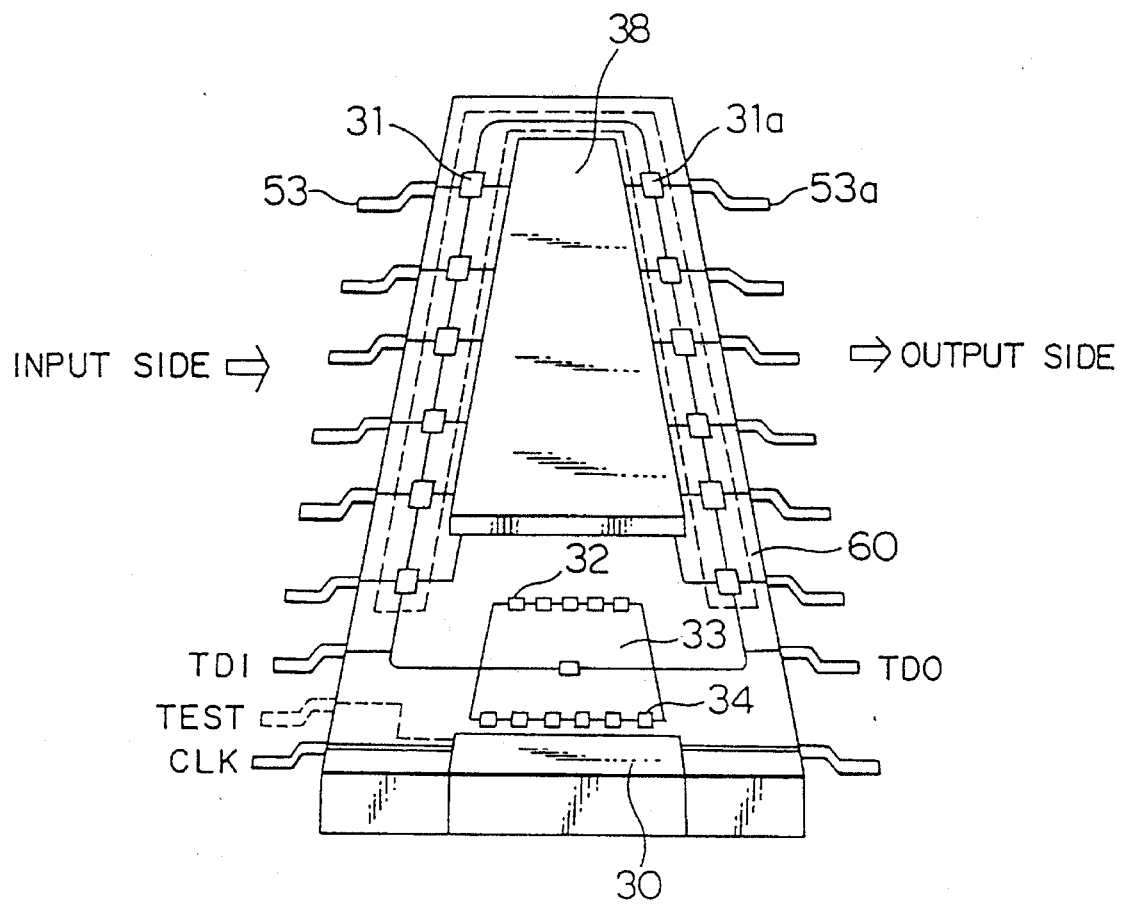
FIG. 1 is a schematic perspective view showing a conventional semiconductor device having a boundary scan test circuit.
Figure 2:
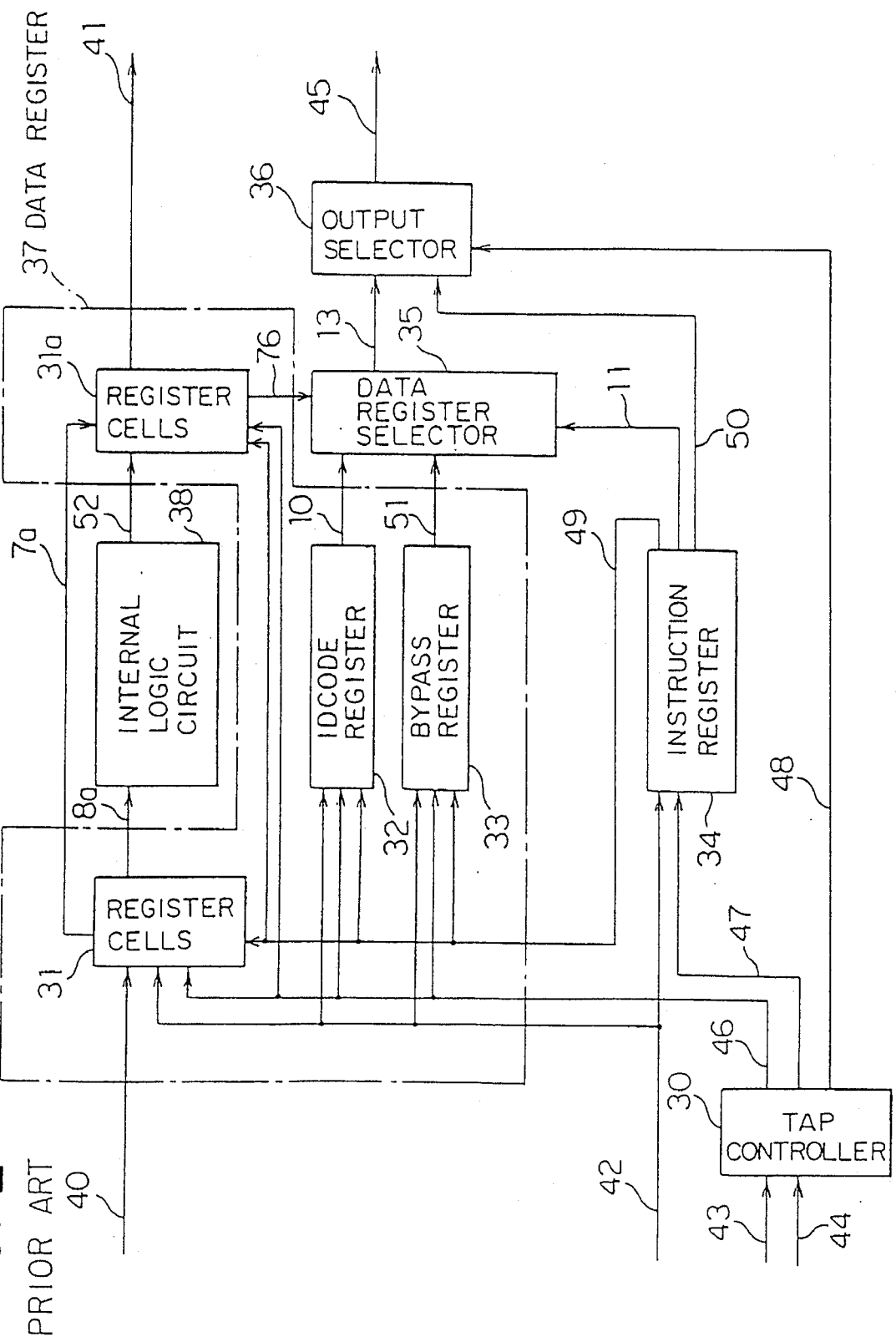
FIG. 2 is a circuit diagram of a conventional boundary scan test circuit.

FIG. 2 shows a conventional boundary scan test circuit. The boundary scan test circuit comprises a TAP (Test Access Port) controller 30, an instruction register 34, a data register selector 35, an output selector 36 and a data register 37, thereby operating the internal logic circuit 38 either in a normal operation mode or in a test operation mode and obtaining necessary data in the test operation mode. The data register 37 is composed of a plurality of boundary scan register cells 31 and 31a respectively corresponding to input and output pins of the semiconductor device, an identification code register (IDCODE register) 32 (32-bit register, for example) for storing inherent information peculiar to the semiconductor device, and a bypass register 33 for bypassing data.

The TAP controller 30 is provided for controlling the overall operation of the boundary scan test circuit. For example, when the TAP controller 30 receives a test mode selection signal 43 designating one of 16 test modes and a test clock (CLK) 44 designating timing for executing the test, the TAP controller 30 generates, based on these signals, a data register control signal (latch signal) 46 designating timing for latching serial data which are input as test data 42, an instruction register control signal 47 and an output switching signal 48.

The instruction register 34 receives the test data input signal 42 and the instruction register control signal 47 to thereby generate a mode switching signal 49, a register switching signal 11, and an instruction register output signal 50. The instruction register 34 has a function for designating the contents of a test to be executed and designating a register to be operated.

Figure 3:
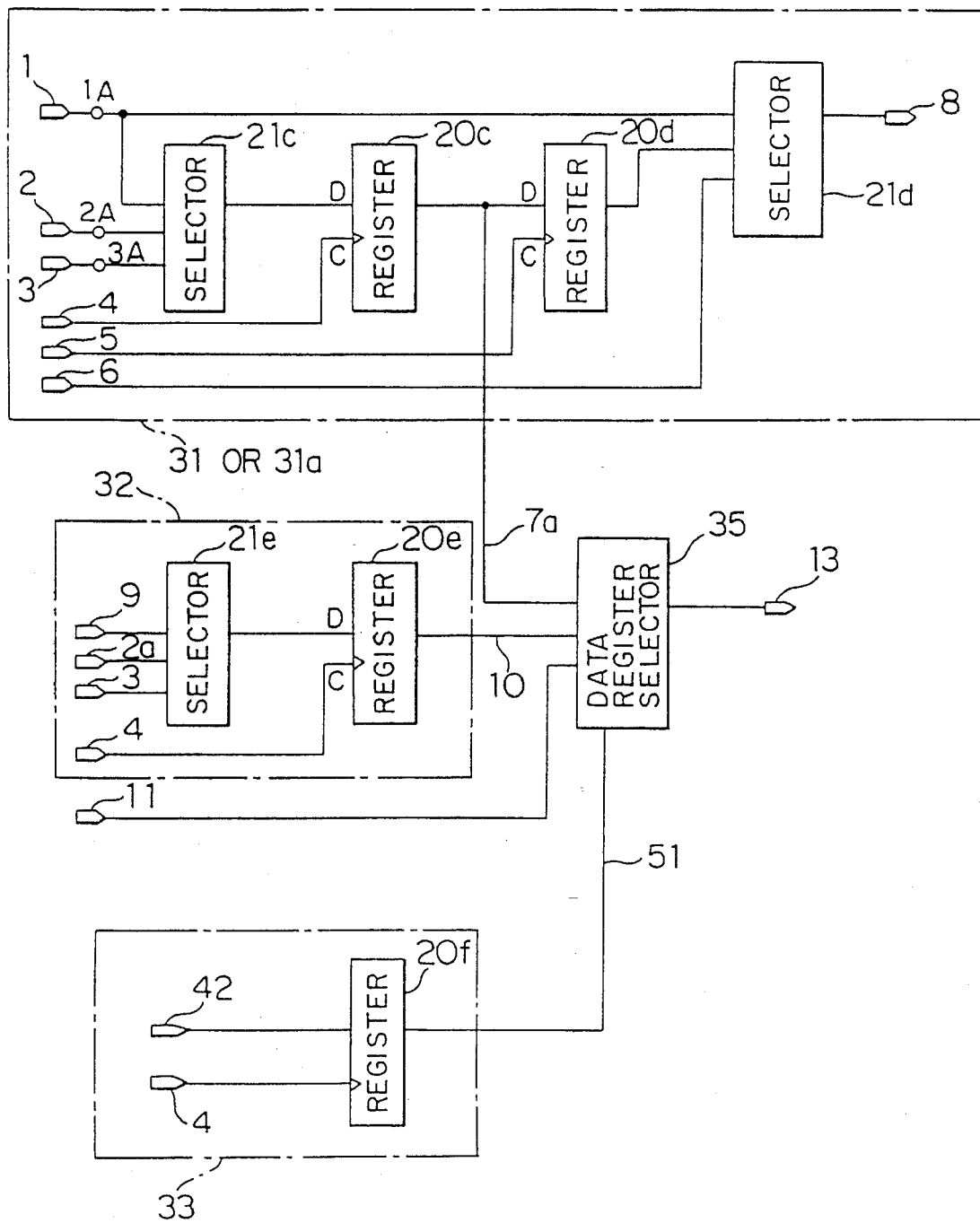
FIG. 3 is a circuit diagram for showing the configuration of the data registers in the boundary scan test circuit shown in FIG. 2.

FIG. 3 shows a typical construction inside the boundary scan register cell 31 or 31a, the identification code register 32, and the bypass register 33 which constitute the data register 37 shown in FIG. 2. The boundary scan register cell 31 or 31a comprises a first selector 21c, a first register 20c, a second register 20d and a second selector 21d cascaded in series. The first selector 21c has a parallel input terminal 1A for receiving parallel data 1 constituting a device input signal 40 or an output signal 52 from the internal logic circuit in FIG. 2, and a serial input terminal 2A for receiving serial test data 2. An input switching signal 3 is also input to the first selector 21c through a terminal 3A as a control signal for switching these parallel data and serial data.

The output of the first selector 21c is supplied to the first register 20c as an input data thereto, while a serial latch signal 4, which is the data register control signal 46 from the TAP controller 30, is input to the first register 20c as a latch signal so as to output serial test data 7a. The output 7a from the first register 20c is supplied to an input terminal 2A of the succeeding register cell 31 or 31a constituting a shift register 60 for transferring the serial test data. In the case of the last register cell 31a of the shift register 60, the output 7a from the first register 21c is supplied to the data register selector 35, as shown in FIG. 3.

The output 7a from the first register 20c is also input to the second register 20d as an input data thereto, while a parallel latch signal 5, which is the output signal 46 from the TAP controller 30, is input to the second register 20d as a latch signal so that parallel data are output from the second register 20d. The second selector 21d receives parallel data 1 from the parallel input terminal 1A and an output signal from the second register 20d, and also receives an output switching signal 6, which is the output signal 46 from the TAP controller 30, for controlling switching of input signals. As a result, a parallel output signal 8, which corresponds to signal 8a or signal 41 in FIG. 2, is obtained in the second selector 21d.

The identification code register 32 is composed of 32 cells each including a third selector 21e and a third register 20e. A serial input signal 2a constituting a test data input signal 42 or ID code signal from a preceding stage of the ID code register is supplied to the third selector 21e, to which an identification code signal 9 is also input. A switching signal 3, which is the output signal 46 from the TAP controller 30, is further input to the third selector 21e for switching those input signals 2a and 9. The output from the third selector 21e is supplied to the third register 20e as an input data thereto, while the serial latch signal 4, which is the output signal 46 from the TAP controller 30, is input to the register 20e as a latch signal so that an identification code signal 10 is output from the register 20e.

The serial output signal 7a, which is the output signal of the register 20c of the boundary scan register cell 31 or 31a, and the identification code output signal 10, which is the output signal of the register 20e of the identification code register 32, are supplied to the data register selector 35. Also, the register switching signal 11 is input to the data register selector 35 for selecting those input data 7a and 10.

The test data input signal 42 composed of a serial data is input to the bypass register 33 together with the serial latch signal 4, and an output signal 51 from the bypass register 33 is input to the data register selector 35.

The data register selector 35 selects one of the serial data output 7a, output signal 10 from the identification code register 32 and the output signal 51 from the bypass register 33 based on the register switching signal 11, and outputs the selected one as the data register output signal 13. The output selector 36 as shown in FIG. 2 selects the data register output signal 13 or the instruction register output signal 50 based on the output control signal 48 supplied from the TAP controller 30, and outputs the selected one as a test data output signal 45.

Figure 4:
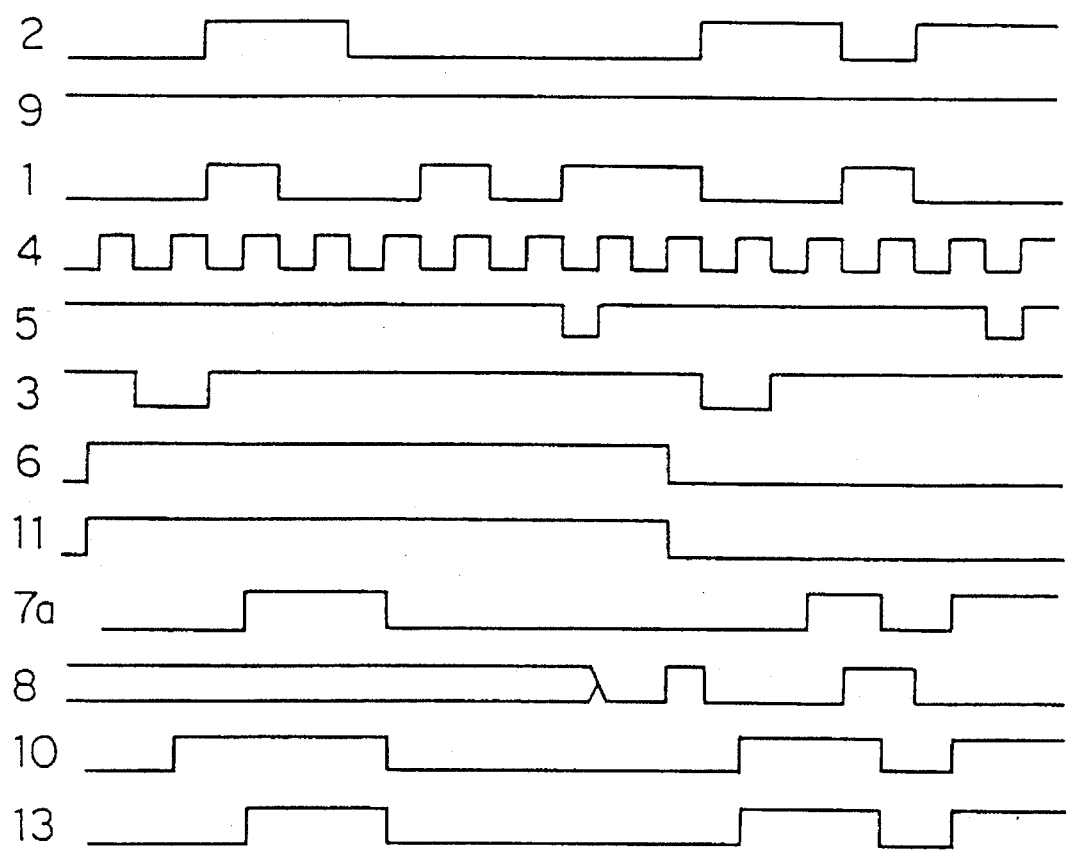
FIG. 4 is a timing diagram of signals in the boundary scan test circuit shown in FIG. 2.

FIG. 4 is a timing diagram of signals supplied to and generated in the conventional boundary scan test circuit as described above. The operation of the boundary scan test circuit of FIG. 3 will be described further with reference to FIG. 4. Selector 21c is controlled by the input switching signal 3 so as to select the parallel data 1 when the input switching signal 3 is at a low level and select the serial data 2 when the signal 3 is at a high level, thereby outputting the selected one. Register 20c latches an output of the selector 21c at the rising edge of the serial latch signal 4, and the output 7a of the register 20c is supplied to register 20d and the data register selector 35. Register 20d latches the output of the register 20c at the rising edge of the parallel latch signal 5. The input switching signal 3 is driven to a low level in accordance with the mode of the TAP controller 30 so that the selection of inputs is switched from the serial input data to the parallel input data.

Selector 21d selects an output signal from register 20d when the output switching signal 6 determined by an operation mode of the semiconductor device is at a high level, and selects a signal from the parallel input data 1 when the output switching signal 6 is at a low level. Selector 21e of the ID code register 32 selects the ID code input signal 9 when the input switching signal 3 is at a low level, and selects the test data input signal 42 or the serial input data 2a, which is the ID code output signal of the preceding stage, when the input switching signal 3 is at a high level. Register 20e latches the selected signal at the rising edge of the serial latch signal 4, and outputs the same as the ID code output signal 10.

The data register selector 35 selects the ID code signal 10 when the register switching signal 11, which is the output of the instruction register 34, is at a low level, and selects the serial output signal 7a when the signal 11 is at a high level. The selected signal is output as a data register output signal 13.

As described above, in the conventional boundary scan test circuit, the boundary scan register cells 31 and 31a are operated as a shift register 60 in a test operation mode so as to transmit serial test data. The serial data are supplied to the internal logic circuit 38 as a parallel data to be fed at once. Also, a parallel data obtained from the internal logic circuit 38 is transmitted as serial data, and output to the outside as a test data output. Moreover, in a normal operation mode, each boundary scan register cell 31 or 31a simply transmits signals between the external connection pins 51 or 51a and the internal logic circuit 38.

The ID code register and the boundary scan register cell are provided in parallel in the data register, and a predetermined control signal is input depending on whether the test mode is a function test mode for the internal logic circuit or a mounting test mode for reading out the ID code of each device. In detail, the test circuit is designed such that the output from the ID code register 32 or the output from the register cell 31 or 31a is selected by the data register selector 35 which is controlled by the input control signal 11. Accordingly, it is necessary to provide the registers in number equal to the sum of the number of the cells of the ID code register 32 and the number of the boundary scan register cells 31 and 31a. Therefore, the conventional boundary scan test circuit has a drawback that a large number of registers are provided for the boundary scan test circuit, so that the chip area required for the boundary scan test circuit is large.

Next, embodiments of the present invention will be described with reference to the drawings. The boundary scan test circuit according to the present invention has a structure similar to that of the test circuit which has been described with reference to FIG. 2 except for the structure of the data register 37. Accordingly, description of a circuit portion having a configuration similar to that in the test circuit of FIG. 2 will be omitted for avoiding a duplication. In the drawings which will be hereinafter referred to, similar elements or similar signals are represented by similar reference numerals and symbols as used in FIGS. 2 through 4.

Figure 5:
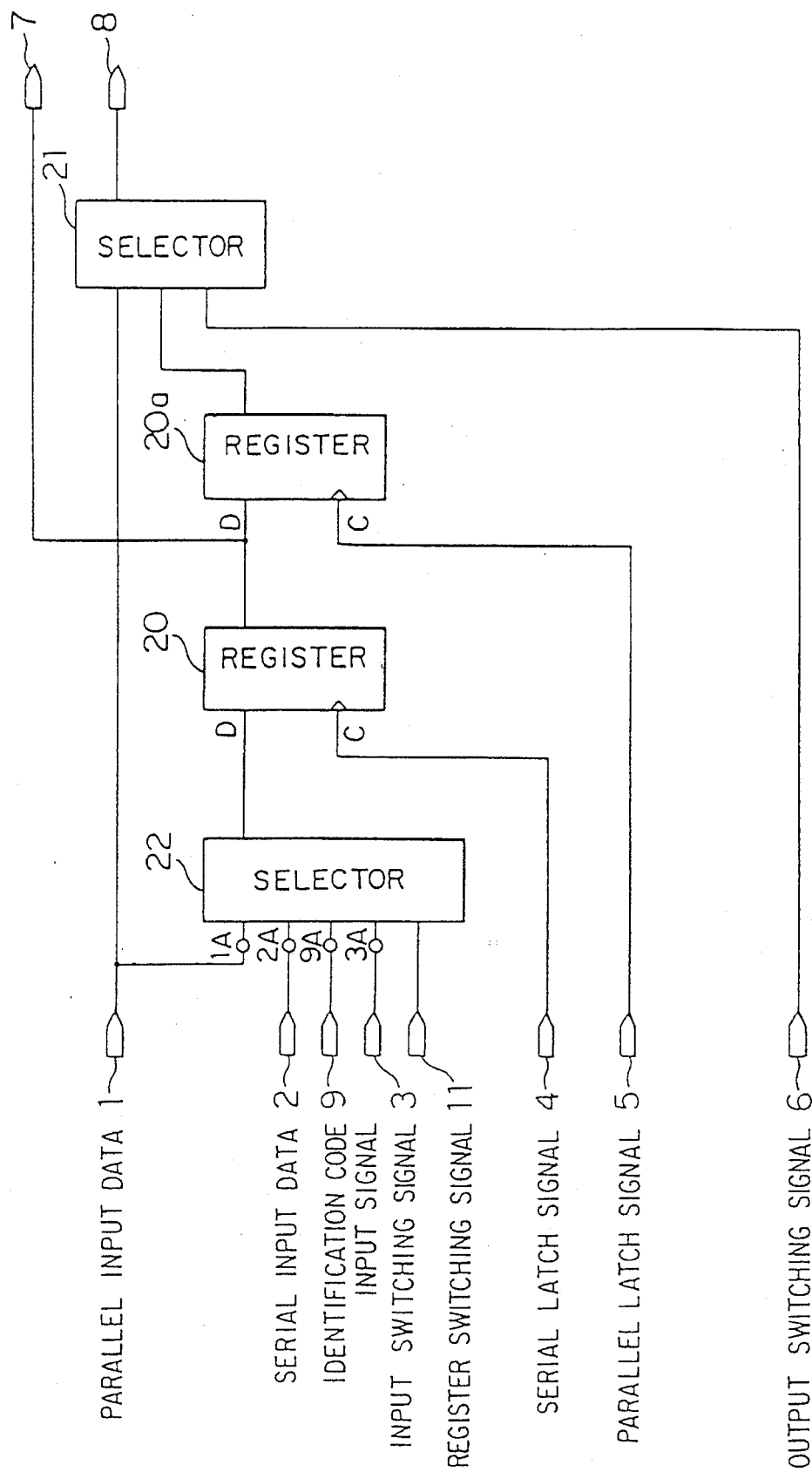
FIG. 5 is a circuit diagram of one of boundary scan register cells in a boundary scan test circuit according to a first embodiment of the present invention.
Figure 6:
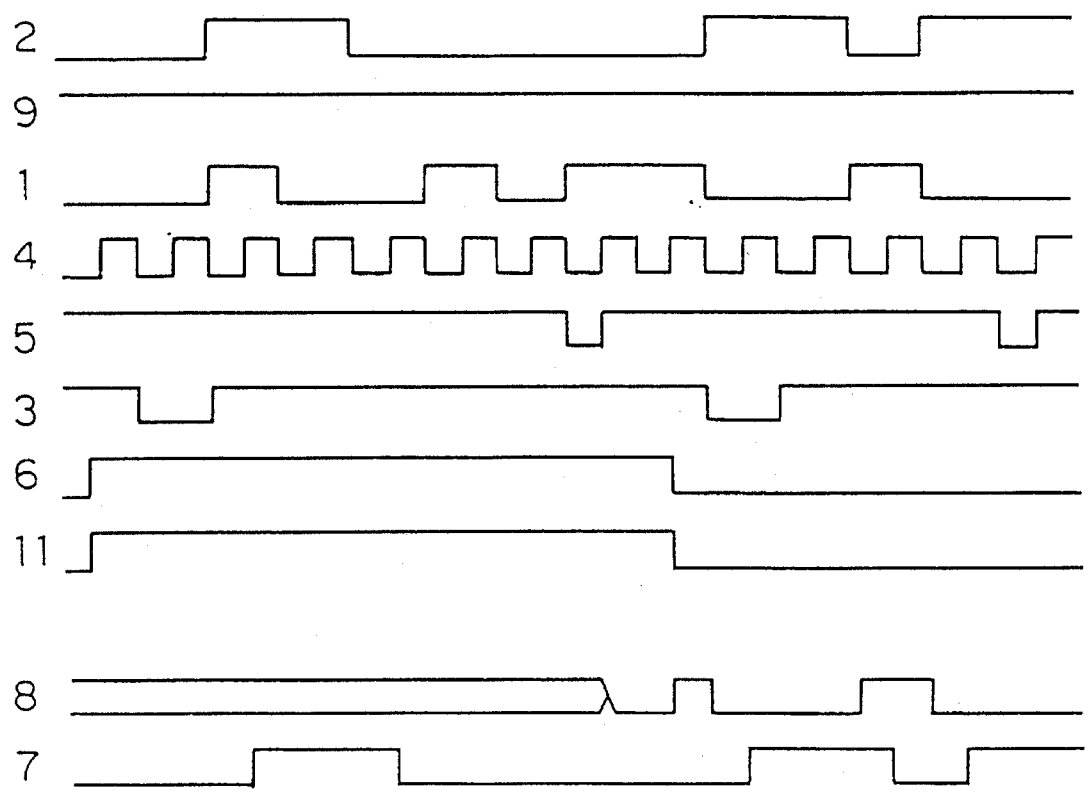
FIG. 6 is a timing diagram of signals in the boundary scan test circuit according to the first embodiment.

FIG. 5 shows a configuration of one of register cells in a boundary scan test circuit according to a first embodiment of the present invention, while FIG. 6 shows a timing diagram of signals in the first embodiment. As shown in FIG. 5, the boundary scan register cell of the boundary scan test circuit is comprised of a first selector 22, a first register 20, a second register 20a and a second selector 21 cascaded in this order.

The first selector 22 has a parallel input terminal 1A for receiving parallel input data 1 during a normal operation mode and a test operation mode, a serial input terminal 2A for receiving serial input data 2 during a test operation mode, and an ID code input terminal 9A for receiving an ID code signal 9 representing one of bits of ID code of the semiconductor device. The ID code input terminal 9A is maintained either at a low level or at a high level depending on the corresponding bit of the ID code. Also, an input switching signal 3 and a register switching signal 11 are input to the selector 22, both signals 3 and 11 constituting control signals for switching those input signals 1, 2 and 9 in accordance with a selected operation mode.

An output signal from the first selector 22 is supplied to the data input of the first register 20, while a serial latch signal 4 is supplied to the control input of the first register 20 as a latch signal. The output signal from the first register 20 and a parallel latch signal 5 are supplied to the data input and the control input of the second register 20, respectively. The parallel input data 1 and the output signal of the second register 20a are supplied to the second selector 21. An output switching signal 6 is also input to the second selector 21 for switching those input signals. The output from the first register 20 is taken out as a serial output signal 7, while the output from the second selector 21 is taken out as a parallel output signal 8.

An output signal 7 from the first register 20 is supplied to a serial input terminal 2 of a successive boundary scan register cell 31 or 31a which is a succeeding stage for the illustrated boundary scan register cell when coupled as a shift register. The output signal 7 of the first register 20 in the last boundary scan register cell 31a, which is the last stage when coupled as a shift register, is supplied as an input signal 7a of the output selector 35 as shown in FIG. 3, an output signal 13 from the output selector (data register selector) 35 selected by changing over between the output of the first register of the last stage and an output from, for example, the bypass register 33. By employing the construction as described above, the ID code register 32 of FIG. 2 can be omitted in the first embodiment.

The operation of the boundary scan test circuit shown in FIG. 5 will be further described with reference to a timing diagram of FIG. 6. The first selector 22 is controlled by the input switching signal 3 and the register switching signal 11. When the input switching signal 3 is at a low level and the register switching signal 11 is at a high level, a parallel input data 1 from the parallel input terminal 1A is selected in the first selector 22. When both the input switching signal 3 and the register switching signal 11 are at a low level responsive to an external signal, a data from an ID code input terminal 9A are selected in the first selector 22. Further, when the input switching signal 3 is at a high level, serial data 2 from the serial input terminal 2A are selected in the first selector 22.

The first register 20 latches an output-signal from the first selector 22 at a rising edge of the serial latch signal 4. The second register 20a latches an output signal from the first register 20 at the rising edge of the parallel latch signal 5. The second selector 21 selects a parallel input data 1 when the output switching signal 6 is at a low level, and selects an output signal from the second register 20a when the output switching signal 6 is at a high level.

For the ID code input terminal 9 of each of the register cells, a code is assigned beforehand in accordance with the ID code peculiar to the semiconductor device. For example, the ID code input terminal 9 is connected to the ground or a power supply line in accordance with the corresponding bit determined for each register cell.

With the construction as described above, the ID code peculiar to the semiconductor device is generated without providing an ID code register. Accordingly, the ID code data of the semiconductor device can be output from the boundary scan test circuit, when required in accordance with particular one of the test modes selected in a test operation mode. The elimination of the ID code register simplifies the structure of the boundary scan test circuit of the semiconductor device, resulting in a smaller chip area of the semiconductor device.

Figure 7:
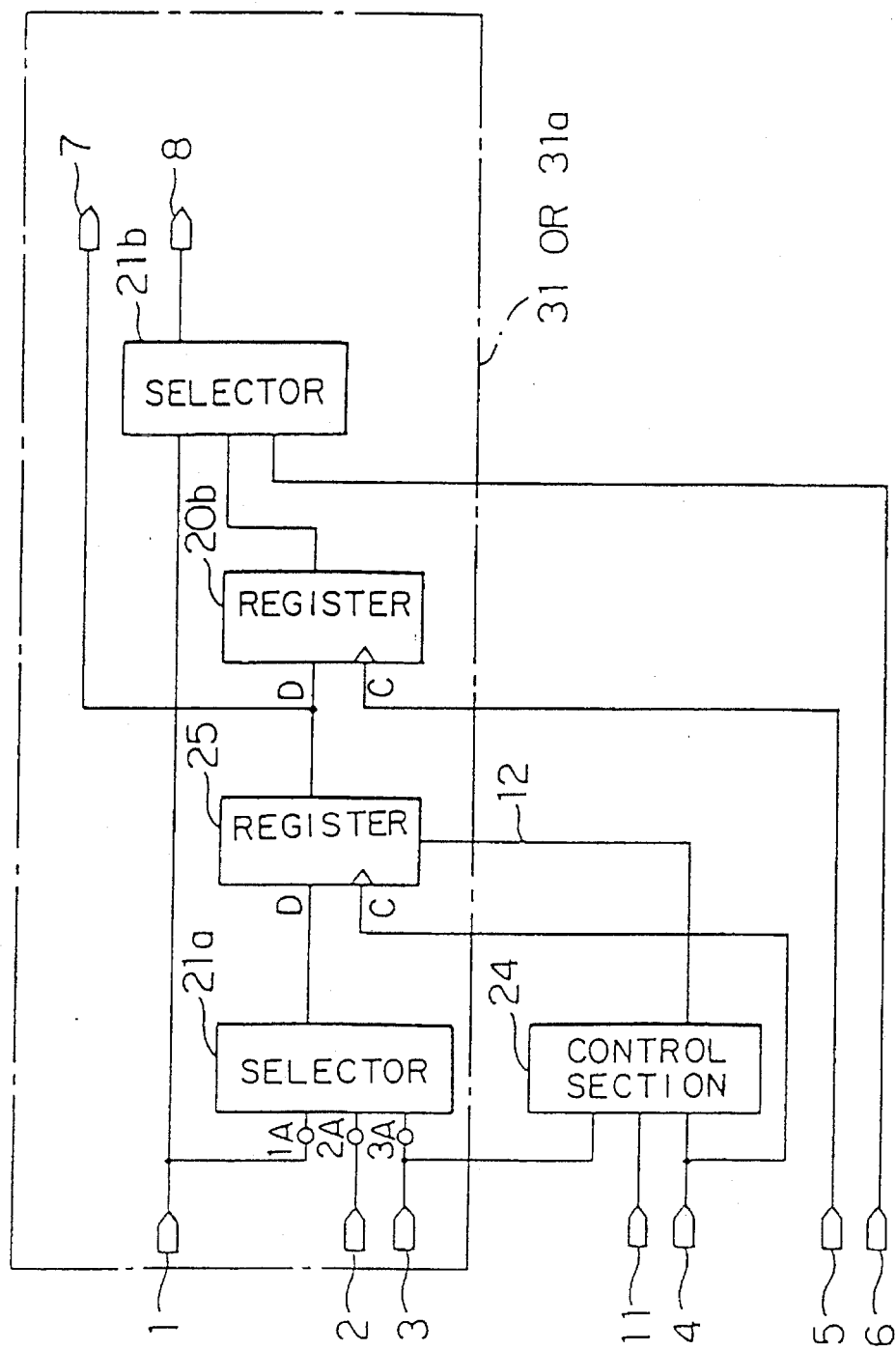
FIG. 7 is a circuit diagram of one of boundary scan register cells in a boundary scan test circuit according to a second embodiment of the present invention.
Figure 8:
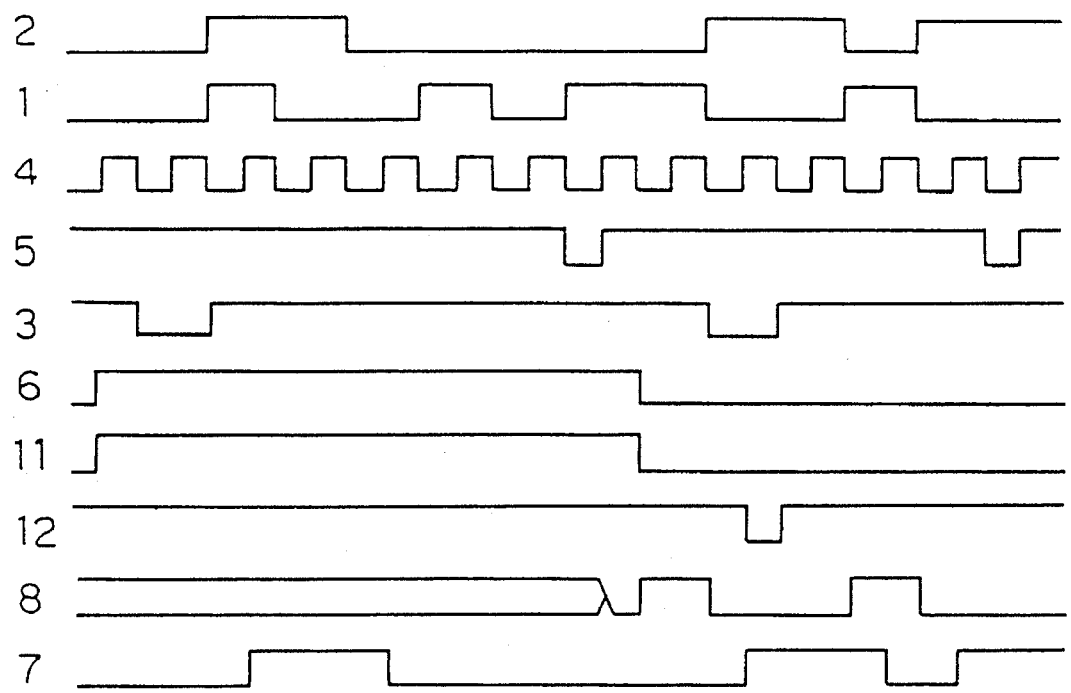
FIG. 8 is a timing diagram of signals in the boundary scan test circuit according the second embodiment.

FIG. 7 is a circuit diagram of one of register cells 31 and 31a of the boundary scan test circuit according to a second embodiment of the present invention, while FIG. 8 is a timing diagram of signals in the second embodiment. The register cell of the boundary scan test circuit according to the present embodiment is provided with a first selector 21a, a second selector 21b, a first register 25 having a set/reset terminal, and a second register 20b. A control section 24 is provided for a shift register including all of the register cells 31 and 31a. Parallel input data 1 and serial input data 2 are supplied to the inputs 1A and 2A of the first selector 21a, respectively. Also, an input switching signal 3 is supplied through a terminal 3A to the first selector 21a for effecting the switching function of the register 25. The input switching signal 3, a serial latch signal 4 and a register switching signal 11 are input to the control section 24 for controlling each of the register cells 31 or 31a.

Figure 9:
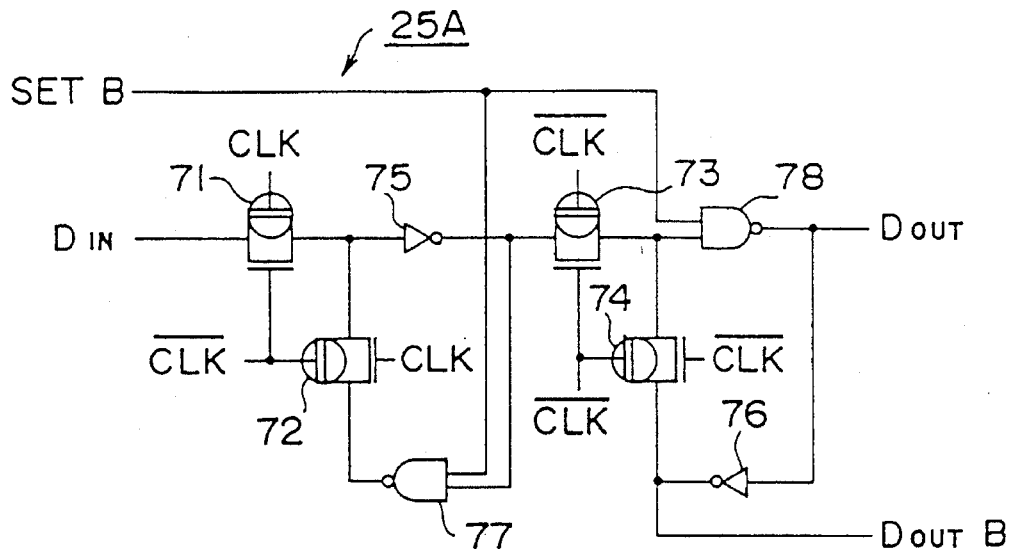
FIG. 9 is a circuit diagram of an example of the first register shown in FIG. 7 having a set terminal.
Figure 10:
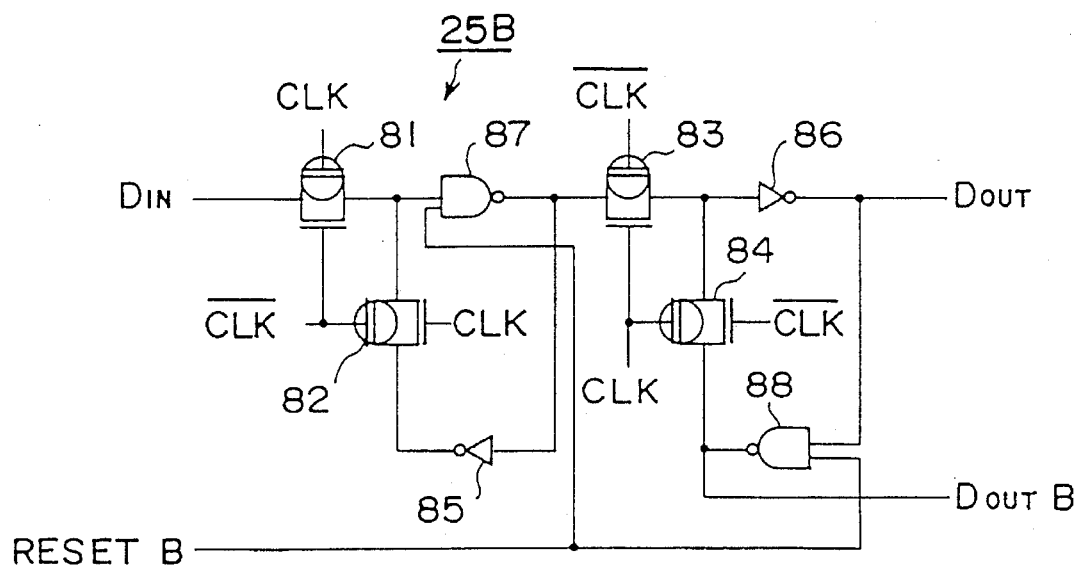
FIG. 10 is a circuit diagram of an example of the first register shown in FIG. 7 having a reset terminal.
Figure 11:
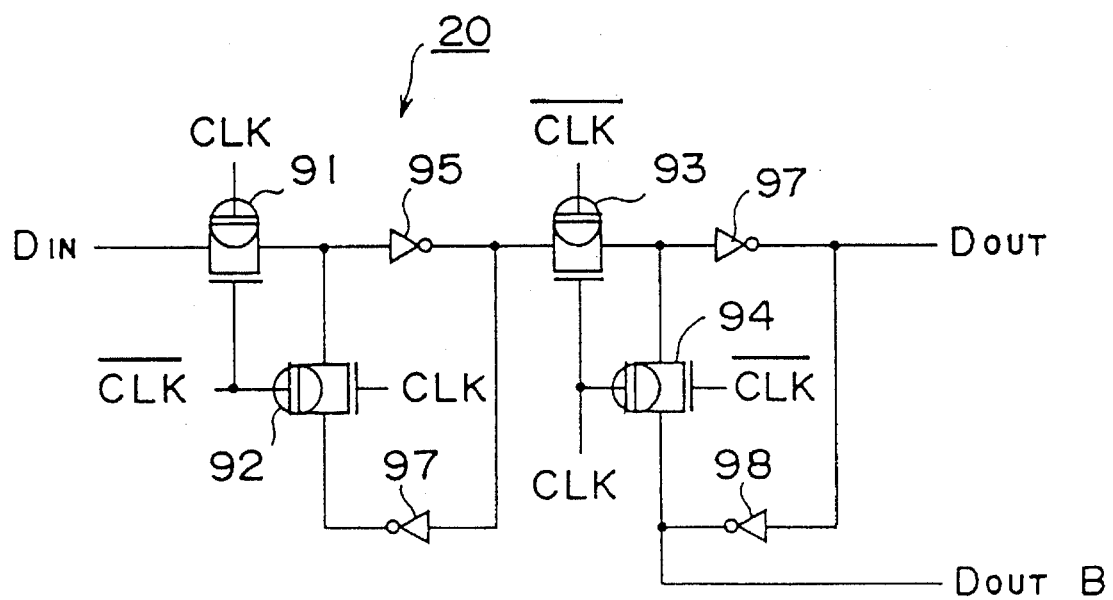
FIG. 11 is a circuit diagram of an example of the first register as shown in FIG. 5.

An output signal from the first selector 21a is supplied to the data input of the first register 25, while the serial latch signal 4 is input to the latch terminal of the first register 25. FIGS. 9 and 10 show examples of the first registers having a set terminal and reset terminals, respectively. In FIG. 9, the first register 25A is comprised of four transfer gates 71 to 74, two inverters 75 and 76, and two NAND gates 77 and 78. When input data $D_{IN}$ is supplied to the first register 25A, the data $D_{IN}$ is latched in response to clock signals CLK and $\overline{CLK}$ and output as the data $D_{OUT}$. The first register 25A is further set by setting signal SETB for outputting a low level signal as the output signal $D_{OUT}$. Similarly, the first register 25B of FIG. 10 latches the input data $D_{IN}$ in response to clock signals CLK and $\overline{CLK}$ and reset by the reset signal RESETB to output a high level signal as the output signal $D_{OUT}$. In comparison to the first register having a set/reset terminals, an example of a first register 20 without set/reset terminal is shown in FIG. 11, the first register 20 being employed in FIG. 5.

An ID code setting signal 12, which is an output of the control section 24, is also input to the set/reset input (R) of the first register 25. An output signal from the first register 25 and a parallel latch signal 5 are input to the second register 20b. The parallel input data 1 and the output of the second register 20b are supplied to the inputs of the second selector 21b. An output switching signal 6 is supplied to the second selector 21b for switching the input signals thereof. A serial output signal 7 is taken out from the first register 25, while a parallel output signal 8 is taken out from the second selector 21b.

Operation of the boundary scan test circuit including register cells as shown in FIG. 7 will be described further with reference to a timing diagram of FIG. 8. The first selector 21a, which is controlled by the input switching signal 3, selects parallel input data 1 when the input switching signal 3 is at a low level, and selects serial input data 2 when the input switching signal 3 is at a high level. The control section 24 sets the ID code setting signal 12 to a low level when both the input switching signal 3 and the register switching signal 11 are at a low level and the serial latch signal 4 is at a high level.

The first register 25 latches an output from the first selector 21a at a rising edge of the serial latch signal 4. When the ID code setting signal 12 is set to a low level due to the output of the instruction register 34 of FIG. 2 determined by an external signal and due to a selected test mode of the TAP controller 30, the first register 25 is set or reset asynchronously with the serial latch signal 4 so that the output of the first register 25 is set to a low level or a high level in accordance with a predetermined bit of the ID code. The second register 20b latches an output from the first register 25 at a rising edge of the parallel latch signal 5. The second selector 21b selects the parallel input signal 1 when the output switching signal 6 is at a low level, and selects an output signal from the second register 20b when the output switching signal 6 is at a high level.

In the second embodiment of the present invention, there are provided the first selector 21a which outputs parallel data or serial data in accordance with the input switching signal 3, and the control section 24 which outputs an ID code setting signal based on the input switching signal and the register switching signal. Through the control on the ID code setting signal, the first register 25 can receive an output signal from the first selector 21a. Since the first register 25 is set in accordance with a code signal representing a bit of the ID code, it is not necessary to provide a register for the bit of the ID code, thereby reducing the area occupied by a semiconductor device having a boundary scan test circuit.

Assuming that a boundary scan test circuit has an ID code register of m bits and a boundary scan register of n bits, for example, it is possible to reduce, from a conventional boundary scan test circuit, registers by X, where the value X is smaller one of m and n. In the case of m>n, for example, the occupied area can be reduced almost by an area corresponding to n registers.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising an internal logic circuit, a plurality of external pins and a boundary scan test circuit including a plurality of boundary scan register cells each disposed correspondingly to associated one of said external pins for transmitting parallel data between said internal logic circuit and said associated one of said external pins, said boundary scan register cells being electrically connected to each other responsive to an external signal to form a shift register for transmitting serial data, each of said boundary scan register cells comprising:

a first selector having a first input for inputting said parallel data, a second input for inputting said serial data and a third input for inputting a code signal representing a bit of an ID code of said semiconductor device, said first selector selecting one of said parallel data, serial data and code signal in accordance with an input switching signal;

a first register for latching an output signal from said first selector in response to a first latch signal;

a second register for latching an output signal from said first register in response to a second latch signal; and a second selector for selecting said parallel data or an output signal from said second register in accordance with an output switching signal, an output signal from said first register of one of said boundary scan register cells constituting said serial data to be input to Succeeding one of said boundary scan register cells when said boundary scan register cells are connected to form said shift register.

2. A boundary scan test circuit according to claim 1 wherein said third input is set at a first potential or a second potential in accordance with said bit of said ID code.

3. A semiconductor device comprising an internal logic circuit, a plurality of external pins and a boundary scan test circuit including a plurality of boundary scan register cells each disposed correspondingly to associated one of said external pins for transmitting parallel data between said internal logic circuit and associated one of said external pins, said boundary scan register cells being electrically connected to each other responsive to a first external signal to form a shift register for transmitting serial data, each of said boundary scan register cells comprising:

a first selector for selecting one of said parallel data and said serial data in accordance with an input switching signal;

a first register for latching an output signal from said first selector in response to a first latch signal, said first register further being set or reset in accordance with a code signal representing a bit of an ID code of said semiconductor device in response to a second external signal;

a second register for latching an output signal from said first register in response to a second latch signal; and a second selector for selecting said parallel data or an output signal from said second register in accordance with an output switching signal, an output signal from said first register of one of said boundary scan register cells constituting said serial data to be input to succeeding one of said boundary scan register cells when said boundary scan register cells are connected to form said shift register.

* * * * *